United States Patent
Reeder et al.

(10) Patent No.: US 7,298,144 B2
(45) Date of Patent: Nov. 20, 2007

(54) HOMODYNE RECONSTRUCTION OF WATER AND FAT IMAGES BASED ON ITERATIVE DECOMPOSITION OF MRI SIGNALS

(75) Inventors: Scott B. Reeder, Middleton, WI (US); Brian A. Hargreaves, San Francisco, CA (US); Jean H. Brittain, Middleton, WI (US)

(73) Assignees: The Board of Trustee of the Leland Stanford Junior University, Palo Alto, CA (US); General Electric Company, Schenectady, NY (US)

( * ) Notice: Subject to any disclaimer, the term of this patent is extended or adjusted under 35 U.S.C. 154(b) by 112 days.

(21) Appl. No.: 11/253,825

(22) Filed: Oct. 18, 2005

(65) Prior Publication Data
US 2006/0250132 A1    Nov. 9, 2006

Related U.S. Application Data

(63) Continuation-in-part of application No. 11/124,041, filed on May 6, 2005, now Pat. No. 7,176,683.

(51) Int. Cl.
*G01V 3/00* (2006.01)
(52) U.S. Cl. .................................... 324/307; 324/309
(58) Field of Classification Search ................ 324/307, 324/309
See application file for complete search history.

(56) References Cited

U.S. PATENT DOCUMENTS 5,243,284 A    9/1993    Noll 6,856,134 B1 *    2/2005    Reeder et al. .............. 324/309
7,042,215 B2 *    5/2006    Moriguchi et al. ......... 324/307
7,151,370 B1 *   12/2006    Hargreaves ................. 324/307

OTHER PUBLICATIONS

U.S. Appl. No. 11/124,041, filed May 5, 2005.
Bredella et al., "Three-Point Dixon Chemical-Shift Imaging for Evaluating Articular Cartilage Defects in the Knee Joint on a Low-Field-Strength Open Magnet", AJR:177, Dec. 2001, pp. 1371-1375.
Dixon, "Simple Proton Spectroscopic Imaging", Radiology 1984; 153:189-194.
Glover, "Multipoint Dixon Technique for Water and Fat Proton and Susceptibility Imaging", JMRI 1991; 1:521-530.
Pineda et al., "Cramer-Rao Bounds for Three-Point Decomposition of Water and Fat", Magnetic Resonance in Medicine 54:625-635 (2005).

(Continued)

*Primary Examiner*—Louis M. Arana
(74) *Attorney, Agent, or Firm*—Beyer Weaver LLP

(57) ABSTRACT

Homodyne image reconstruction is combined with an iterative decomposition of water and fat from MR signals obtained from a partial k-space signal acquisition in order to maximize the resolution of calculated water and fat images. The method includes asymmetrical acquisition of undersampled MRI data, obtaining low resolution images, and then estimating a magnetic field map and phase maps of water and fat image signals from the low resolution images. The acquired data is again filtered and Fourier transformed to obtain an estimate of combined fat and water signals using the estimated magnetic field map and phase maps. Water and fat images are then estimated from which phases of the water and fat images are determined. The real parts of the water and fat images are then used in calculating water and fat images using a homodyne process.

24 Claims, 7 Drawing Sheets

OTHER PUBLICATIONS

Reeder et al., "Homodyne Reconstruction and IDEAL Water-Fat Decomposition", Magnetic Resonance in Medicine 54:586-593 (2005).

Reeder et al., "Rapid Cartilage Imaging with SSFP and Four-Point Dixon Techniques", Poster, ISMRM, May 24, 2002, 1 page.

Reeder, et al., "Rapid MR Imaging of Articular Cartilage with Steady-State Free Precession and Multipoint Fat-Water Separation", AJR 2003; 180:357-362.

Reeder et al., "Asymmetric Echoes for Robust Fast Spin-Echo "Dixon" Water-Fat Separation", RSNA 2004, Chicago. (RSNA Research Fellow Award, Physics: Reeder SB).

Reeder et al., "Iterative Decomposition of Water and Fat With Echo Asymmetry and Least-Squares Estimation (IDEAL):Application With Fast Spin-Echo Imaging", Magnetic Resonance in Medicine 54:636-644 (2005).

Rybicki et al., "Fast Three-Point Dixon MR Imaging Using Low-Resolution Images for Phase Correction: A Comparison with Chemical Shift Selective Fat Suppression for Pediatric Musculoskeletal Imaging", AJR 2001; 177:1019-1023.

Xiang, "Water-Fat Imaging with Direct Phase Encoding", JMRI 1997; 7:1002-1015.

* cited by examiner

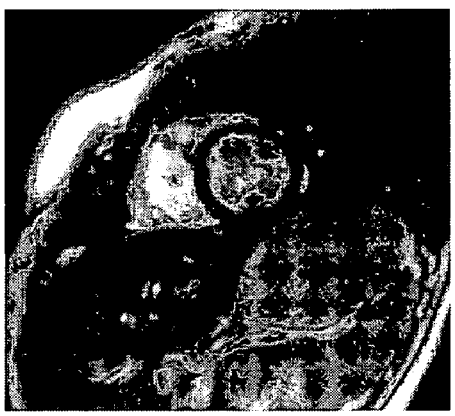
FIG. 4A  FIG. 4B
FIG. 4C  FIG. 4D
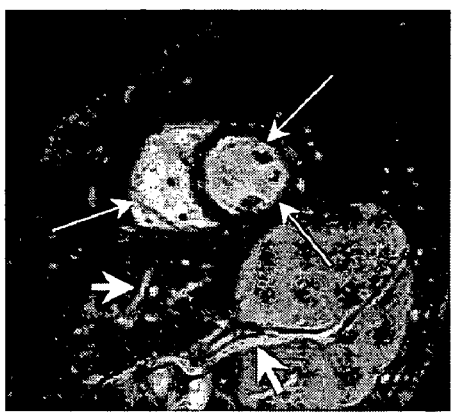
FIG. 4E  FIG. 4F

HOMODYNE RECONSTRUCTION OF WATER AND FAT IMAGES BASED ON ITERATIVE DECOMPOSITION OF MRI SIGNALS

CROSS REFERENCE TO RELATED APPLICATIONS

This patent application is a continuation-in-part of prior U.S. application Ser. No. 11/124,041, filed May 6, 2005 now U.S. Pat. No. 7,176,683 entitled "ITERATIVE DECOMPOSITION OF WATER AND FAT WITH ECHO ASYMMETRY AND LEAST SQUARE ESTIMATION", from which priority under 35 U.S.C. §120 is claimed and which is incorporated herein by reference for all purposes.

GOVERNMENT RIGHTS

The U.S. government has rights in the disclosed invention pursuant to NIH Grant No. P41RR09784 to Stanford University.

BACKGROUND OF THE INVENTION

This invention relates generally to magnetic resonance imaging (MRI), and more particularly the invention relates to water-fat signal separation in MRI.

Uniform fat separation is necessary for many MRI applications and can be challenging in the presence of main field, Bo, inhomogeneities.

As noted by Reeder et al. in U.S. Pat. No. 6,856,134 for "Magnetic Resonance Imaging With Fat-Water Signal Separation", in phase and out of phase imaging was first described by Dixon in 1984 and was used to exploit the difference in chemical shifts between water and fat in order to separate water and fat into separate images. Glover further refined this approach in 1991 with a three-point method that accounts for Bo field inhomogeneities. Hardy et al first applied this method to fast spin-echo imaging (FSE) by acquiring three images with the readout centered at the spin-echo for one image and symmetrically before and after the spin-echo in the subsequent two images. These water-fat separation methods have since been combined with both spin-echo (SE) and FSE imaging for many applications (8-13). Several of these three-point approaches acquire one image with the readout centered at the spin-echo and the other two acquired symmetrically on each side of the spin-echo. This approach has the advantage of minimizing the time between refocusing pulses of the fast spin-echo train while providing sufficient time between echoes for phase between water and fat to evolve. Initial descriptions of the relationship between echo spacing and noise performance of water-fat decomposition have been reported, however, these approaches do not fully characterize the theoretical noise performance of water-fat separation methods.

Heretofore, decomposition of water from fat with Dixon methods has not been possible when the proportion of water and fat within a voxel is approximately equal.

Further, partial k-space MR data acquisitions are commonly used in MRI to reduce acquisition time and the amounts of raw data necessary to reconstruct an image. Homodyne imaging is a known technique for reconstructing data sets into images. However, all phase information is lost with homodyne imaging which is incompatible with "Dixon" fat-water signal separation that depends on phase information.

Pending application Ser. No. 11/124,041, entitled "ITERATIVE DECOMPOSITION OF WATER AND FAT WITH ECHO ASYMMETRY AND LEAST SQUARE ESTIMATION", discloses an improved method of separating water and fat signals based on asymmetrical signal acquisition relative to a spin-echo in an imaging sequence followed by an iterative decomposition and least squares signal estimation.

The present invention employs a homodyne image reconstruction of water and fat signals as acquired and separated in accordance with the disclosure of application Ser. No. 11/124,041.

SUMMARY OF THE INVENTION

In accordance with the invention, homodyne image reconstruction is combined with an iterative decomposition of signals for at least two species such as water and fat in MR signals obtained from a partial k-space signal acquisition in order to maximize the resolution of calculated water and fat images.

Generally, the image reconstruction includes acquiring low resolution image information at multiple echo times, and acquiring some fraction of higher resolution image information at multiple echo times. Low resolution images of species and a low resolution field map are estimated from the acquired data, and then using the low resolution images of species and low resolution field map estimation, reconstruct higher resolution species images from the partial higher resolution image information.

More specifically, in one embodiment the method includes asymmetrically acquiring under-sampled MRI data, obtaining low resolution images, and then estimating a magnetic field map and phase maps of water and fat image signals from the low resolution images.

The acquired data is filtered and Fourier transformed to obtain filtered source images. The low resolution field map is demodulated from the filtered source images. Separate water and fat images, for example, are then estimated. The low resolution phase maps of the low resolution water and fat images are then demodulated from the estimated water and fat images. High resolution water and fat images are obtained from the real part of the phase demodulated water and fat images.

In a multi-coil acquisition, the steps leading to homodyne image calculation are repeated for signals from each coil, and then the combined water and fat images are calculated using standard multi-coil reconstruction including use of the square root of the sum of the squares of the coil pixel signals.

The invention and objects and features thereof will be more readily apparent from the following detailed description and appended claims when taken with the drawings.

BRIEF DESCRIPTION OF THE DRAWINGS

FIGS. 4A-4F are calculated end-diastolic cardiac CINE IDEAL-SSFP recombined (a,d), water (b,e) and fat (c,f) images from a healthy volunteer acquired with a four-coil phased array. Images are reconstructed with simple zero-filling (a-c), and homodyne reconstruction (e-f). 224×128 SSFP images were acquired with partial $k_x$ acquisition (134 points, readout oriented up-down in image). Homodyne reconstructed images have less apparent blur than zero-filled images, most notable along the endocardial border, trabeculae, and papillary muscles (long, thin arrows). Vessels of the liver and spleen also appear sharper (short, fat arrows).

DETAILED DESCRIPTION

Figure 1A:
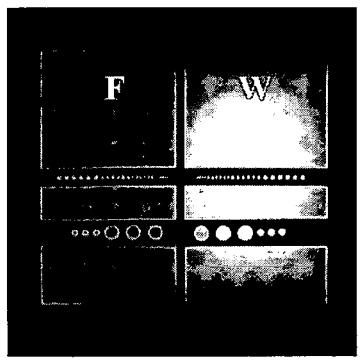
FIGS. 1A-1F are recombined (a,d), calculated water (W) (b,e), and calculated fat (F) (c,f) IDEAL images of a water-oil resolution phantom, demonstrating the distribution of water and oil within the phantom. The image plane is parallel to the floor, along the long axis of the cylinder. The k-space data has been artificially filtered in the $k_y$ direction (vertical) to simulate asymmetric sampling in this direction, with echo fraction of 0.625. Images in the top row (a-c) are reconstructed with zero-filling and the bottom row (d-f) reconstructed with the proposed homodyne method. The zero-filled images (top row) appear slightly blurred in the phase encoding direction, in comparison to the homodyne reconstructed images (bottom row).
Figure 1B:
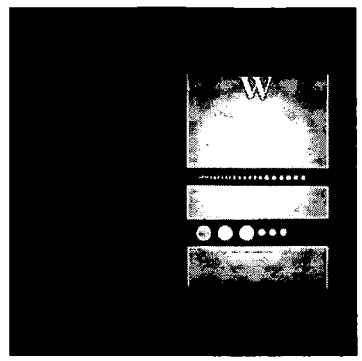
Figure 1C:
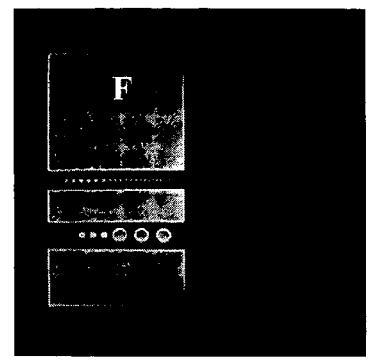
Figure 1D:
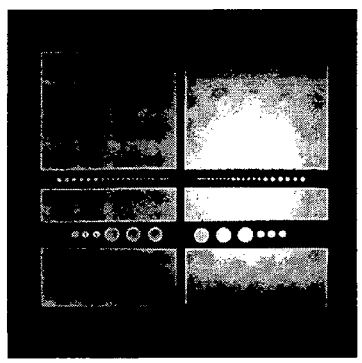
Figure 1E:
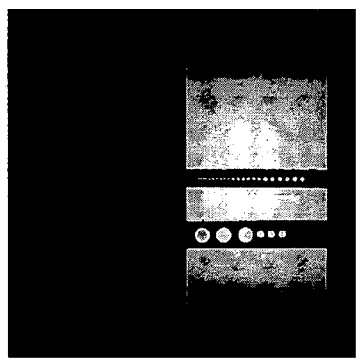
Figure 1F:
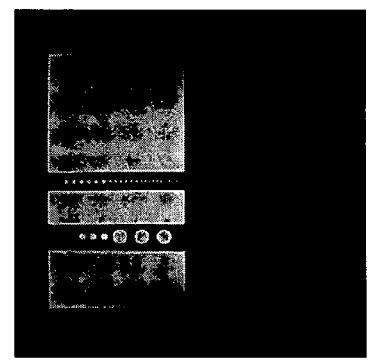

As noted above, reliable separation of water from fat using "Dixon" approaches has shown renewed interest in recent years, as it provides uniform separation of water from fat despite the presence of $B_0$ and $B_1$ field inhomogeneities. The method described in co-pending application Ser. No. 11/124,041, supra, acquires three images, each with a slightly different echo times (TE), and analytical or least squares methods are then used to decompose these "source" images into separate water and fat images. Extension to multi-coil applications has also been described recently.

Partial k-space acquisitions in the readout direction are important for applications that must reduce the minimum TE, first moment phase shifts from motion or flow in the readout direction, and the minimum TR. Short TR's are essential for good image quality for Dixon-SSFP applications to prevent banding artifacts while maintaining high spatial resolution in the readout direction. Partial readout acquisitions would also be important for rapid Dixon-SPGR methods that require short TE and TR.

The three-fold increase in image acquisition time for Dixon methods is often problematic for many applications, particularly when over-sampling strategies in the phase encoding direction ("no phase wrap") are used to prevent aliasing. Although Dixon acquisitions are highly SNR efficient, there is a three-fold increase in scan time compared with a conventional fat-saturated exam. In order to prevent aliasing in the phase encoding direction, additional interleaved lines of k-space can be acquired to increase the field of view in the phase encoding direction. Doubling the number of acquired lines of k-space, for example, would result in a six-fold increase in the minimum scan time of a conventional fat-saturated exam. This lengthy scan time is unacceptable for many clinical settings. Reductions in scan time through partial $k_y$ acquisitions would be very helpful towards addressing this problem.

Partial k-space acquisitions have seen very limited use with Dixon water-fat separation methods. Homodyne reconstruction, and other related methods are commonly used to reconstruct partial k-space acquisitions, exploiting the Hermitian symmetry of k-space in order to maximize spatial resolution. Unfortunately, homodyne methods demodulate all phase information from complex images. The phase of the source images acquired at the different echo times contains the information required to decompose water from fat. For this reason, the unsampled portions of k-space matrices acquired with partial acquisitions are filled with zeroes and although the essential phase information is preserved, the resulting images will experience moderate blurring.

Initial attempts to apply homodyne reconstruction to Dixon methods have been described by Ma et al for echo sampling schemes that acquired echoes at echo times with phase differences between water and fat of 0, π/2 and π. See Ma et al., "*Method for Efficient Fast Spin Echo Dixon Imaging*", MRM 2002;48(6):1021-1027. In this work, conventional homodyne reconstruction was applied to the images acquired with water-fat phase shifts of 0 and π when signal from water and fat are exactly in phase (0) or exactly out of phase (π). At these particular phase values, no phase information has been introduced from chemical shift. In this approach the middle source image (π/2) was reconstructed with simple zero-filling, however, and some blurring of the middle source image would be expected.

In this invention, we combine homodyne reconstruction with an iterative least squares water-fat decomposition method (application Ser. No. 11/124,041). Using this combination, resolution of calculated water and fat images can be maximized for partial k-space acquisitions. This method is extended to multi-coil applications and applied to partial $k_x$ (frequency encoding) acquisitions for IDEAL-SSFP water-fat separation and partial $k_y$ (phase encoding) acquisitions for IDEAL-FSE water-fat separation. Examples in a water-oil resolution phantom and in normal volunteers are shown.

Signal Behavior

The signal from a pixel at position r containing magnetization from water (W) and fat (F) acquired at discrete echo times $t_n$ (n=1, ..., N), in the presence of field inhomogeneity, $\psi(r)$ (Hz), can be written, $$s_n(r)=(W(r)+F(r)e^{i2\pi\Delta f_{fw}t_n})e^{i2\pi\psi(r)t_n}=(W(r)+c_nF(r))d_n(r) \quad (1)$$

where the relative chemical shift of fat relative to water is $\Delta f_{fw}$, approximately −210 Hz at 1.5 T and −420 Hz at 3 T, $c_n=e^{i2\pi\Delta f_{fw}t_n}$ and $d_n=e^{i2\pi\psi(r)t_n}$. It is important to emphasize that $c_n$ is a known complex coefficient, independent of position, r, while $d_n$ is unknown and dependent on position. It is also important to note that W(r) and F(r) are complex, with independent phase, such that $W(r)=|W(r)|e^{i\phi(r)_W}$ and $F(r)=|F(r)|e^{i\phi(r)_F}$. If the field map, $\psi(r)$, is known, then the exponential $d_n=e^{i2\pi\psi(r)t_n}$ can be demodulated from equation 1 and water and fat are easily decomposed in the least squares sense. If $d_n$ is unknown, an iterative method can be used to calculate the field map, and water and fat subsequently decomposed in the least squares sense.

Under-Sampled Data and Filters

If a fully sampled data set is represented by equation 1, then a partial k-space acquisition could be represented by $$s'_n(r)=F\{S_n(k)G(k)\}=s_n(r)*g(r) \quad (2)$$

where F{ } represents the Fourier transform operator, and $$G(k) = \begin{cases} 1 & -k_{min} < k < k_{max} \\ 0 & \text{otherwise} \end{cases} \quad (3)$$

and $k_{min}$ is distance from the center to the edge of the under-sampled half of k-space, and $k_{max}$ is the distance to the edge of the fully sampled half of k-space. $s'_n(r)$ will be blurred in comparison to the fully sampled image, $s_n(r)$ because g(r) has a finite-width imaginary component.

As part of the homodyne reconstruction below, one of two transition filters are typically used. The first is a ramp transition filter, $$G_R(k) = \begin{cases} 1+k/k_{min} & -k_{min} < k < k_{min} \\ 2 & k_{min} < k < k_{max} \\ 0 & \text{otherwise} \end{cases} \quad (4)$$

and the second choice is the step weighting function $$G_R(k) = \begin{cases} 1 & -k_{min} < k < k_{min} \\ 2 & k_{min} < k < k_{max} \\ 0 & \text{otherwise} \end{cases} \quad (5)$$

Both of these functions (or other similar transition functions) can be used for homodyne reconstruction, and each has its advantages/disadvantages. Finally, we define a low-pass filter, $$G_L(k) = \begin{cases} 1 & -k_{min} < k < k_{min} \\ 0 & \text{otherwise} \end{cases} \quad (6)$$

which will also be used in the homodyne reconstruction described below.

Homodyne Approach

Figure 6:
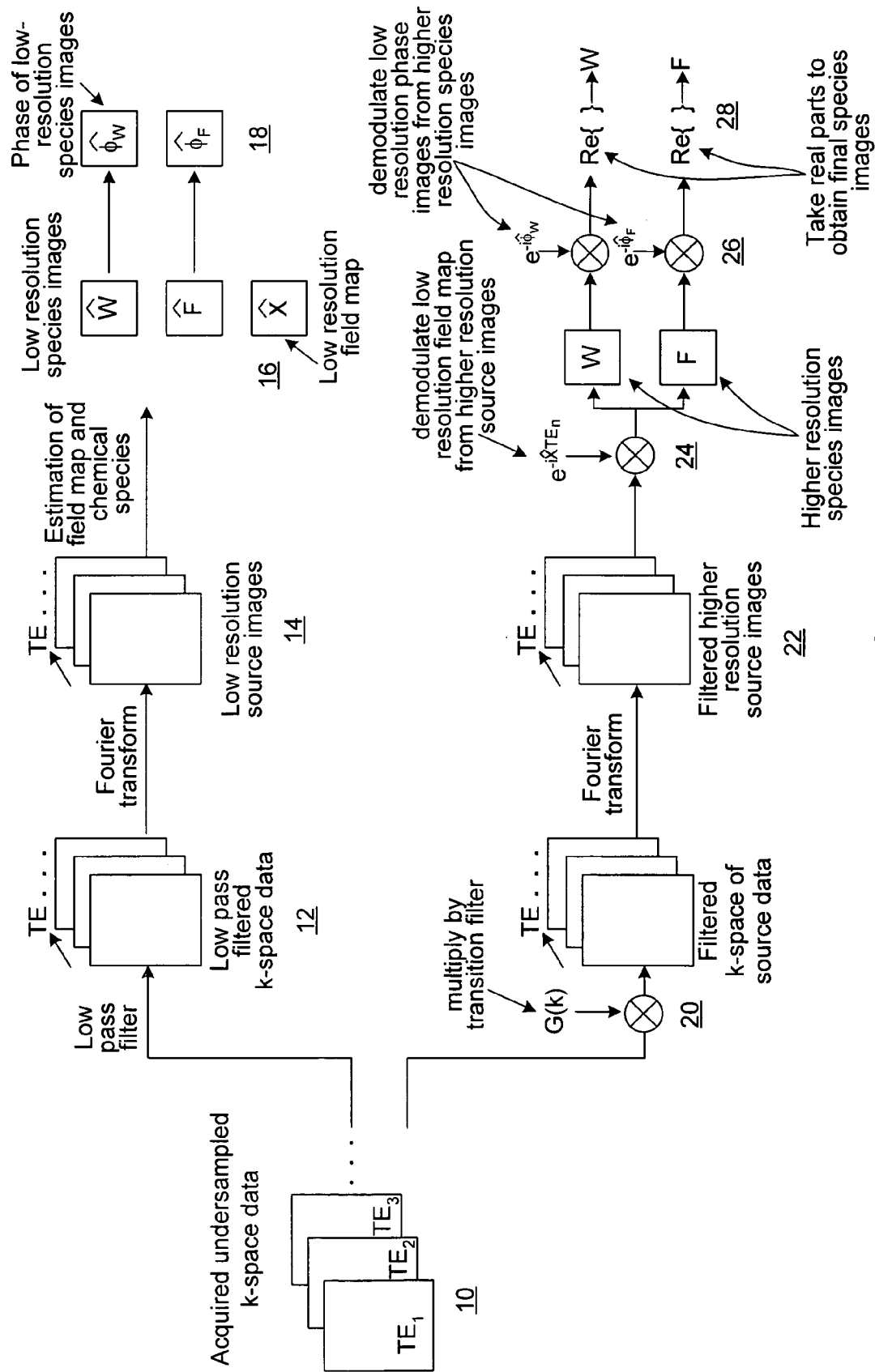
FIG. 6 is a flow diagram illustrating steps in implementing one embodiment of the invention.

FIG. 6 is a flow diagram of one embodiment of the homodyne reconstruction of species (e.g. water, fat) images in accordance with the invention. Undersampled k-space data is acquired at 10.

The first step is to filter the sampled k-space data with the low pass filter $G_L(k)$ at 12, and perform the Fourier transform to obtain images at 14 that have low resolution in the undersampled direction, $$\hat{s}_n(r)=F\{S_n(k)(G_L(k))\}=s_n(r)*g_L(r) \quad (7)$$

Assuming that the field map, $\psi(r)$, is smoothly varying, a good estimate of the field map ($\hat{\psi}(r)$ and equivalently $\hat{d}^n=e^{i2\pi\hat{\psi}(r)t_n}$) can be made at 16 using the iterative approach. In addition, low-resolution estimates of the complex water and fat images can also be made, and from these, estimates of the phase maps of the water and fat images are made at 18, i.e.:

$$\hat{W}(r)=|\hat{W}(r)|e^{i\hat{\phi}(r)_W} \text{ and } \hat{F}(r)=|\hat{F}(r)|e^{i\hat{\phi}(r)_F} \quad (8)$$

If $\hat{\phi}_W(r) \approx \phi_W(r)$ and $\hat{\phi}_F(r) \approx \phi_F(r)$, then these terms can be used below to demodulate the phase maps of the final water and fat images, as is done with conventional homodyne reconstruction.

Next, the sampled data is filtered at 20 with a transition filter $G_R(k)$ (eg. ramp transition function or step function), and Fourier transformed at 22 such that $$\tilde{s}_n(r)=F\{S_n(k)G_R(k)\}=((W(r)+c_nF(r))d_n(r))*g_R(r) \quad (9)$$

If it can be assumed that the field map is smoothly varying such that $d_n(r)$ varies only slightly over the width of $g_R(r)$, similar to the assumptions made by Noll et al for phase maps (Homodyne Detection in MRI, IEEE Transactions on Medical Imaging 1991; 10(2): 154-163), which allows $d_n(r)$ to be brought through the convolution, i.e.:

$$\tilde{s}_n(r) \approx (W(r)*g_R(r)+c_nF(r)*g_R(r))d_n(r)=(\tilde{W}(r)+c_n\tilde{F}(r))d_n(r) \quad (10)$$

Assuming $\hat{d}_n(r)$ is approximately equal to $d_n(r)$, low resolution estimates of $\hat{d}_n(r)$ obtained above from the low-pass filtered images are now used at 24 to demodulate $d_n(r)$ from equation 10, and estimates of filtered water and fat images are made with least-square method, such that, $$\tilde{W}(r)=|W(r)|e^{i\phi_W(r)}*g_R(r) \approx |W(r)|*g_R(r)e^{i\phi_W(r)} \quad (11a)$$

and $$\tilde{F}(r)=|F(r)|e^{i\phi_F(r)}*g_R(r) \approx |F(r)|*g_R(r)e^{i\phi_F(r)} \quad (11b)$$

where it has been assumed that the $\phi_W(r)$ and $\phi_F(r)$ vary only slightly over the width of $g_R(r)$ as is assumed with conventional homodyne reconstruction, so that the phasor terms can be brought through the convolution.

At 26, the phase of the water and fat images are then demodulated from equations 11a and 11b using the low resolution estimates of the phase of the water and fat images ($\hat{\phi}_W(r)$, $\hat{\phi}_F(r)$). Finally, the water and fat images are calculated at 28 from the real part of the demodulated water and fat images, $$|W(r)|\approx Re\{\tilde{W}(r)e^{-i\hat{\phi}W(r)}\}=Re\{|W(r)|*g_R(r)e^{-i\hat{\phi}W(r)}\} \quad (12a)$$

and $$|F(r)|\approx Re\{\tilde{F}(r)e^{-i\hat{\phi}F(r)}\}=Re\{|F(r)|*g_R(r)e^{i\phi F(r)}e^{-i\hat{\phi}F(r)}\} \quad (12b)$$

in the same manner as conventional homodyne reconstruction.

Application with Multi-Coil Acquisitions

The combination of homodyne imaging with Dixon water-fat separation for multi-coil applications is extended from previous work combining the iterative least squares water-fat decomposition with multi-coil acquisitions. Using a similar approach as this work, the low-resolution field map is calculated for each of the P coils. A combined field map is then calculated for each pixel as the sum of the P low-resolution field maps, each weighted by the square of the signal from the source images, $$\hat{\psi}_c = \frac{\sum_{p=1}^{P} \hat{\psi}_p |s_p|^2}{\sum_{p=1}^{P} |s_p|^2} \quad (13)$$

where $s_P$ is the local signal, determined from the average magnitude of the three source images at that pixel. The combined field map is then demodulated from the source images for each coil and water and fat calculated in the least squares sense, in the same manner described previously for multi-coil acquisitions. The phase of the low resolution complex water and fat images calculated from each coil ($\hat{\phi}_P^W(r),\hat{\phi}_P^F(r)$) will be demodulated later from the high resolution images calculated in the next step. The ramp transition or step function filter ($G_R(k)$) is applied to each k-space data set for each coil, and the 2D-Fourier transform is performed. The combined field map is then demodulated from the filtered source images (eq. 10), and P water and P fat images are calculated using the least squares decomposition. Next, the low-resolution phase terms, $\hat{\phi}_P^W(r)$ and $\hat{\phi}_P^F(r)$ are demodulated from the calculated complex water and fat images and the real part of these images taken. The phase of the water and fat images must be demodulated separately for each coil, because there may be constant phase differences between the images acquired with the different coils. Finally, the P water images are combined using a standard multi-coil reconstruction method (square-root of the sum of the squares) described by Roemer. The same calculations are performed for the fat images, and the algorithm is summarized below.

1. For each coil
   a. Apply low pass filter $G_L(k)$ to asymmetric k-space data
   b. Perform 2D Fourier transform
   c. Calculate low-resolution field maps, $\hat{\psi}_P(r)$, as well as low-resolution phase maps of water ($\hat{\phi}_P^W(r)$) and fat ($\hat{\phi}_P^F(r)$) images with iterative least squares method
2. Calculate combined field map, $\hat{\psi}_c$, using equation 13
3. For each coil
   a. Filter the asymmetric k-space data with ramp transition or step function filter ($G_R(k)$)
   b. Perform 2D Fourier transform
   c. Demodulate $d_n(r)$ terms from source images using combined low resolution field map, ($\hat{\psi}_c(r), d_n^c = e^{i2\pi\hat{\psi}^{c(r)t_n}}$)
   d. Calculate filtered P water and P fat images with least squares decomposition (eqs. 11a, 11b)
   e. Demodulate phase terms ($\hat{\phi}_P^W(r),\hat{\phi}_P^F(r)$) from P water and P fat images
   f. Keep real part of each water and fat image
4. Calculate combined water (and fat) image using standard multi-coil reconstruction (square root of the sum of the squares).

In practicing the invention, all scanning was performed at 1.5 T (Signa TwinSpeed, GE Healthcare, Milwaukee, Wis.) and 3.0 T (vH/i, GE Healthcare, Milwaukee, Wis.). All human studies were approved by our institutional review board (IRB) and informed consent was obtained for all human studies.

Imaging of a water-oil resolution phantom was performed at 1.5 T with a conventional transmit/receive head coil, and three-point fast spin-echo (FSE) sequence modified to allow arbitrary echo shifts, necessary to decompose water from fat. Echoes were positioned asymmetrically with respect to the spin-echo (−0.40 ms, 1.19 ms, 2.78 ms), based on a chemical shift of −210 Hz at 1.5 T, to maximize the SNR performance of the water-fat decomposition. The resolution phantom was a plexiglass cylinder divided into two equal halves, one filled with 7 mM $CuSO_4$ in distilled water, and the other filled with peanut oil. Within each halve, two plexiglass bars containing multiple holes of varying sizes were placed centrally in order to create detailed structure within images.

A helpful measure of sampling asymmetry in partial k-space acquisitions is the "echo fraction", which is defined as the quotient of the actual number points acquired and the fully-encoded matrix size. For example, with a 256 matrix dimension, a readout with an echo fraction of 0.625 implies that 160 points are acquired; 32 points for $k_x<0$, and the remaining 128 for $k_x>0$. For partial $k_y$ and $k_z$ acquisitions, the echo fraction is proportional to the scan time and directly reflects scan time reductions through partial k-space acquisitions.

Imaging in the knee of a normal volunteer was performed at 1.5 T with the same FSE sequence, using a conventional transmit/receive knee coil. Imaging parameters included: FOV=16 cm, slice/gap=3.0/0.5, BW=±20 kHz, TR/TE=5000/48, 256×256 full resolution imaging matrix, and one average. Total scan time for 22 slices was 5:35 min.

Non-contrast angiographic imaging of the arteries of the lower leg of a normal volunteer was performed at 3.0 T using a transmit-receive quadrature extremity coil (MRI Devices, Waukesha, Wis.) and a 3D-SSFP pulse sequence modified to acquire images at different echo shifts, necessary to decompose water from fat. This approach is based on the work of Brittain et al. Imaging parameters included: BW=±100 kHz, TR=4.7 ms, TE=1.1/1.7/2.3 ms, $FOV_x$=24 cm, $FOV_y$=19.2 cm, $FOV_z$=9.6 cm with 256×204×96 matrix size for 0.9×0.9×1.0 $mm^3$ resolution. The fractional readout acquired 160 points (echo fraction=0.625).

Finally, cardiac CINE SSFP imaging acquired at 1.5 T using a retrospectively gated CINE SSFP sequence, and a four element phased array torso coil was performed in a normal volunteer. Imaging parameters included: FOV=32 cm, slice=8 mm, 224×128 (134 point fractional readout, echo fraction=0.60), and BW=±125 kHz. TE increment was 0.9 ms and TR was 4.9 ms.

Decomposition of water and fat images for full resolution and zero-filled data matrices was performed with the iterative least squares water-fat decomposition method, and reconstruction with the homodyne approach used the approach described above. In order to prevent ambiguities between assignment of water and fat within a calculated image, a "robust" reconstruction approach was combined with both the conventional iterative method and the proposed homodyne method.

Figures 2A, 2B, 2C, 2D, 2E, 2F, 2G:
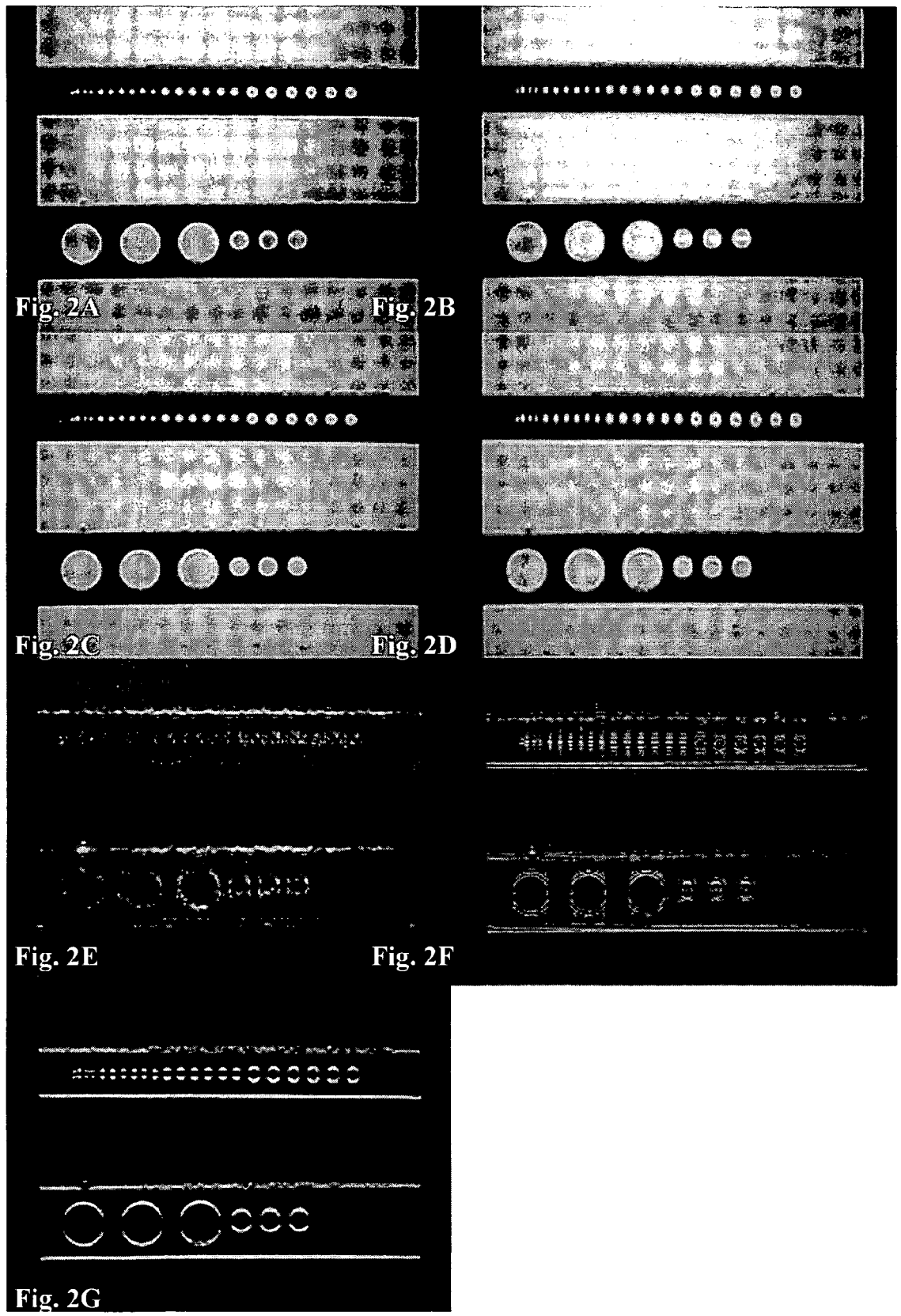
FIGS. 2A-2F are calculated water phantom images reconstructed with a) full resolution acquisition (256×256). After artificial partial $k_y$ asymmetric under sampling (phase encoding direction=vertical), reconstruction with b) zero-filling, c) the proposed homodyne method, and d) ramp filter only without homodyne reconstruction. The difference between full resolution reconstruction and homodyne reconstructed image is shown in (e), and is displayed with window/level set to 10% of the window level of the images in a-c. f) difference image between the zero-filled image (b) and the homodyne reconstructed image (c). g) difference image between homodyne reconstructed image (c) and ramp filtered image (d). The latter two difference images (f,g) have window/level set to half that of images in a-d.
Figure 3A:
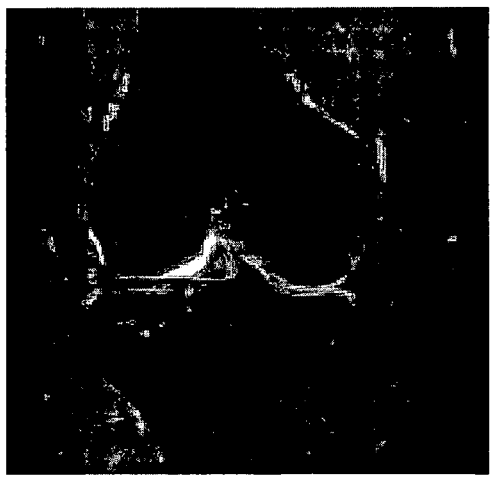
FIGS. 3A-3E are calculated water images of a sagittal T2W FSE image from the knee of a normal volunteer, reconstructed with a) full resolution acquisition (256×256). After artificial partial $k_y$ asymmetric undersampling (160 points), reconstruction with b) simple zero-filling, and c) the proposed homodyne method. The phase encoding direction is in the left-right direction. The difference between full resolution reconstruction and homodyne reconstructed image is shown in (d), and is displayed with window/level at 10% of images in a-c, to show the subtle differences between the images. The difference between homodyne reconstruction and zero-filling reconstruction is shown in (e), and is displayed at the same window/level as the images in (a-c).
Figure 3B:
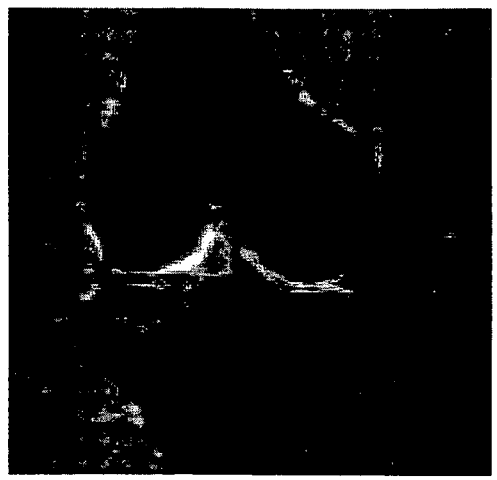
Figure 3C:
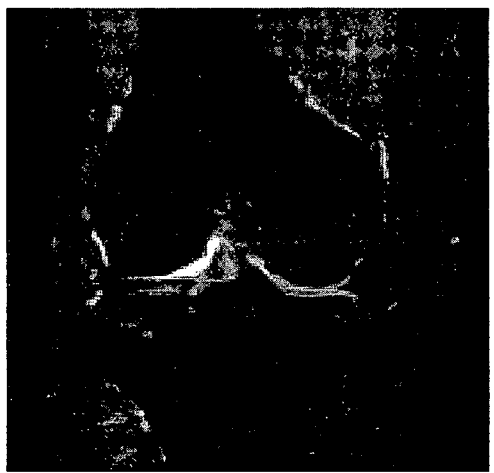
Figure 3D:
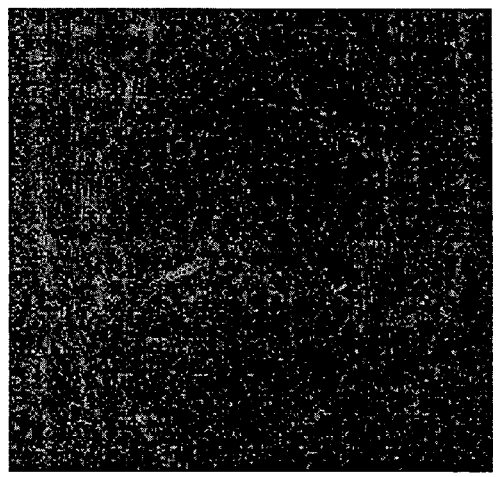
Figure 3E:
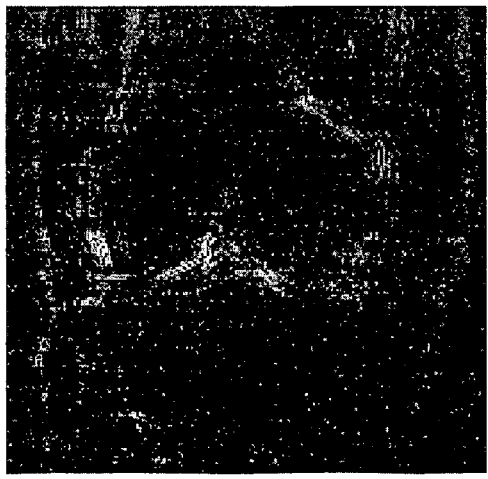
Figure 5A:
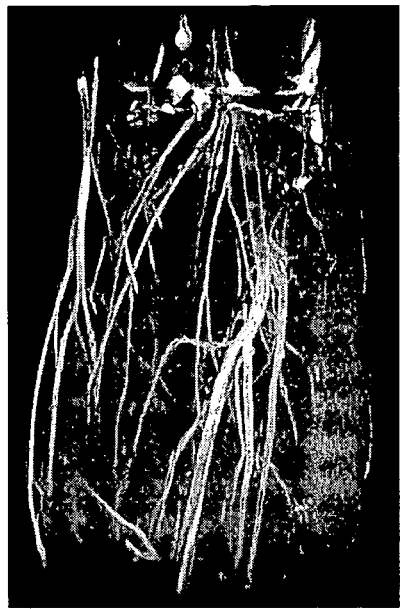
FIGS. 5A-5F are maximum intensity projection images of 3D non-contrast enhanced angiographic IDEAL-SSFP water images of the left popliteal trifuraction of a healthy volunteer, acquired with partial $k_x$ readout (160 points). The readout direction is vertically oriented. Reconstruction was performed with a) zero-filling, and b) homodyne. Fat-saturated acquisition is shown (c) for comparison, and close-up of each image is shown in (d-f). Full matrix size of these acquisitions is 256×204×96 with spatial resolution of 0.9× 0.9×1.0 mm$^3$. Arrows depict small, horizontal vessels that appear sharper in the homodyne reconstructed image (b,e) relative to the reconstruction using zero-filling (a,d).
Figure 5B:
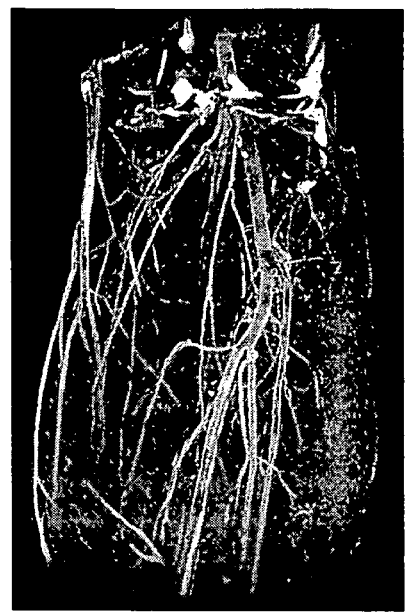
Figure 5C:
Figure 5D:
Figure 5E:
Figure 5F:

FIG. 1 shows the IDEAL water-fat decomposition of a full resolution acquisition in the water-oil resolution phantom, after artificial asymmetric filtering of $k_y$ lines (echo fraction=0.625, 160 points) to simulate a partial $k_y$ acquisition. Reconstruction with simple zero-filling (a-c) and the proposed homodyne method (d-f) are shown, revealing improved apparent spatial resolution and absence of ringing in the zero-filled images. FIG. 2. shows cropped water images from the same acquisition, including a full-resolution reconstruction (FIG. 2a) for comparison. In addition, an image reconstructed by filtering the raw k-space matrix with the ramp filter (eq. 4), but no additional processing is shown in FIG. 2d. Although there is considerable improvement in blurring and ringing from the zero-filled reconstruction shown in FIG. 2b, there is still some blurring evident in the up-down direction. The image in FIG. 2e is the difference between the full-resolution reconstruction (FIG. 2a) and the homodyne reconstructed image (FIG. 2c), and is displayed with window and level settings adjusted to accentuate the subtle differences between the two images. Areas of greatest disparity occur, as expected, at edges where spatial frequencies are greatest and may break the assumption of smoothly varying phase and field map. In addition, difference images between the homodyne reconstructed image (FIG. 2c) and the zero-filled image (FIG. 2b), as well as the difference between the homodyne reconstructed image (FIG. 2c) and the ramp-filtered image (FIG. 2d) are shown in FIGS. 2f and 2g, respectively, revealing relatively large differences between these images. Overall, there is obvious improvement in the apparent resolution of the homodyne reconstructed image in comparison to the zero-filled image and ramp filtered image, while the homodyne reconstructed image and full-resolution image have a very similar appearance.

FIG. 3 shows calculated IDEAL water images obtained from a T2W FSE acquisition obtained in the sagittal plane from a normal volunteer. FIG. 3a shows a full resolution image, while FIGS. 3b and 3c contain water images reconstructed after asymmetric removal of multiple $k_y$ lines (echo fraction=0.625), using zero-filling (FIG. 3b) and homodyne (FIG. 3c). FIG. 3d contains the difference image between the full resolution and homodyne reconstructed images. Improvement in the apparent spatial resolution of the homodyne reconstructed image is seen in comparison with the zero-filled image and has very similar appearance to the full-resolution image.

FIG. 4 shows calculated water, fat and recombined short axis CINE images from one phase (of 20) multi-coil IDEAL-SSFP cardiac acquisition in a normal volunteer. The readout of this acquisition was a fractional echo with 154 of 256 points (echo fraction=0.6), acquired asymmetrically in the $k_x$ direction (left-right). The top row is reconstructed with simple zero-filling, while the bottom row has been reconstructed with the homodyne method. Subtle but definite improvement in the sharpness of the homodyne reconstructed images can be seen. This was most noticeable when the images are played as a movie.

Finally, FIG. 5 contains maximum intensity projection (MIP) images of 3D non-contrast enhanced angiographic IDEAL-SSFP images of the left popliteal trifurcaction of a healthy volunteer, acquired with partial $k_x$ readout (superior-inferior, 160 points). Reconstruction was performed with zero-filling (FIG. 4a) and the homodyne method (FIG. 4b). A fat-saturated SSFP angiographic image is shown for comparison (FIG. 4c), and has similar sharpness as the homodyne reconstructed image.

In summary, we have described a novel combination of conventional homodyne reconstruction with a multi-coil iterative least squares water-fat separation algorithm, facilitating partial k-space acquisitions with maximized spatial resolution. Both phantom and in vivo images, acquired with either conventional or phased array coils, demonstrate dramatically improved resolution over simple zero-filling of unsampled areas of k-space, and demonstrate very similar image quality to full k-space acquisitions. Comparison of homodyne reconstructed phantom images with phantom images reconstructed with a ramp filter also showed improved spatial resolution.

The ability to reconstruct full resolution images from partial $k_y$ data sets will allow for substantial decreases in overall scan time. Typical echo fractions are 0.55-0.65, providing a 40% decrease in the minimum scan time with minimal compromise to image quality. Partial $k_x$ acquisitions are beneficial for short TR sequences such as SSFP and SPGR, and could also be used to minimize first moment phase shifts. Maintaining a short TR is particularly important for SSFP to reduce banding artifacts caused by local field inhomogeneities.

As Noll et al described in their original description of homodyne imaging, signal to noise ratio (SNR) will be expected to decrease as the fraction of unsampled k-space increases, although in the low SNR regime, homodyne reconstruction of fully sampled data sets may actually improve SNR. A full SNR analysis of this method in the context of water-fat separation was not performed for the current study.

The effects of decreasing the acquired echo fraction on image quality were also not investigated in this work. The distribution of spatial frequencies of phase shifts within an image are highly dependent on the acquisition method as well as the object itself. It should be expected that the proposed method would have similar sensitivity to aggressively small echo fractions as conventional homodyne reconstruction methods. With very low echo fractions, however, images reconstructed with zero-filling will have considerably degradation of image resolution while those reconstructed with the proposed homodyne method should maintain high resolution, so long as the assumptions that spatial frequency distributions of the field map and constant phase shifts are not grossly violated.

Conventional homodyne reconstruction algorithms assume that phase shifts within an image are smoothly varying in space. These phase shifts are a combination of those caused by field inhomogeneities ($d_{fn}(r)$), and constant phase shifts ($\phi_W(r)$, $\phi_F(r)$), and are the same phase shifts seen with Dixon methods. It should be reasonable to expect that these assumptions will be equally valid for conventional homodyne as for homodyne Dixon algorithms. In fact, phase shifts caused by chemical shift between water and fat may have very rapid spatial variation, and could be problematic for partial k-space acquisitions using conventional homodyne reconstruction, and the proposed IDEAL-homodyne method may actually have decreased sensitivity to aggressively small echo fractions. For example, consider a gradient echo image acquired with TE>0 such that the phase between water and fat is non-zero (and not equal to 180°). In this case, the spatial frequencies of phase shifts from water-fat chemical shift are coupled with the spatial frequencies of the internal water-fat structures within the object, which may have high spatial frequencies, particularly at tissue interfaces. However, with the IDEAL-homodyne method described above, the homodyne component of the algorithm is applied after water-fat separation has occurred. Further work needs to be performed to understand fully the relationship of echo fraction on image quality and water-fat decomposition.

Homodyne reconstruction methods can also be used to reduce scan time with 3D acquisitions using partial $k_z$ (depth encoding) acquisitions. Combination of homodyne reconstruction methods with Dixon water-fat separation methods using partial $k_z$ acquisitions should be a straightforward extension of the algorithm described above.

This algorithm could also be applied to methods like those described by Ma et al, where prefocussing gradients are used to shift the center of partial echo readouts, shortening the time between refocusing pulses for FSE acquisitions. This method improves sequence efficiency and may reduce blurring artifacts in the phase encoding direction, caused by $T_2$ decay, by reducing the spacing between refocussing pulses. A similar approach could be used with the IDEAL-SSFP water-fat separation method to shift the center of the echo by adjusting the readout prephaser. The homodyne method would then be necessary to reconstruct the images shifted by means of prephasers rather than a bulk shift of the entire readout gradient. This would help shorten TR, which would reduce potential banding artifacts, and improve sequence efficiency.

Further, partial k-space acquisitions could potentially be combined with parallel imaging methods that are already used with Dixon water-fat separation methods. This would facilitate even further reductions in minimum scan times.

This invention has demonstrated the successful implementation of partial k-space reconstruction methods in combination with multi-coil "Dixon" water-fat separation. This approach will help improve the spatial resolution of images generated by water-fat decomposition methods that have previously relied on simple zero-filling techniques. This will facilitate the use of partial readout methods used to obtain short TR and TE, as well as partial $k_y$ and $k_z$ methods used to reduce total scan time.

The invention has been described with reference to specific embodiments. However, the description is illustrative of the invention and is not to be construed as limiting the invention. For example, the embodiments employ spin MR sequences, but the invention can employ other echo coherent MR sequences such as gradient echo and steady state free precession (SSFP) sequences. Further, species other than water and fat can be imaged, such as carbon 13 metabolites. Thus, various modifications and applications may occur to those skilled in the art without departing from the true spirit and scope of the invention as defined by the appended claims.

What is claimed is:

1. A method of separating and imaging at least two species using magnetic resonance imaging (MRI) comprising steps of:
    a) acquiring low resolution image information at multiple echo times,
    b) acquiring some fraction of the higher resolution information at multiple echo times,
    c) estimating low resolution images of species content and a low resolution field map estimate from (a) including low pass filtering the acquired data, and performing a Fourier transform on the filtered data to obtain the low resolution source images in a sampled k-space direction and estimating a magnetic field map using the low resolution source images and determining phase of the low resolution species images,
    d) using the low resolution images of species content and low resolution field map estimates in (c) to reconstruct higher resolution species images from the partial information in (b), wherein step d) includes separately filtering the acquired image information of steps a) and b) with a transition filter and performing a Fourier transform of the filtered data to obtain filtered source images, estimating high resolution species images from the filtered source images using the field map from step (c), demodulating the phase of low resolution species images determined from step (c) from estimated higher resolution species images, and calculating final species images from the real parts of the phase demodulated higher resolution species images.

2. A method of separating and imaging at least two chemical species using a magnetic resonance imaging (MRI) sequence comprising the steps of:
    a) acquiring undersampled MRI data at multiple echo times,
    b) low pass filtering the acquired data,
    c) performing a Fourier transform of the filtered data to obtain low resolution source images in the undersampled k-space direction,
    d) estimating low resolution species images and a magnetic field map using low resolution source images.
    e) determining the phase of the low resolution species images,
    f) separately filtering the acquired data in step (a) with a transition filter and performing a Fourier transform of the filtered data to obtain filtered source images,
    g) estimating high resolution species images from the filtered source images in step (f) using the field map from step (d),
    h) demodulating the phase of low resolution species images determined from step (e) from estimated higher resolution species images,
    i) calculating final species images from the real parts of the phase demodulated higher resolution species images.

3. The method of claim 2 wherein the at least two species include water and fat.

4. The method of claim 2 wherein the at least two species include water and silicone.

5. The method of claim 2 wherein the at least two species are Carbon 13 metabolites.

6. The method of claim 2 wherein in step f) a ramp transition function filter is employed.

7. The method of claim 6 wherein in step g) a least-squares calculation is employed.

8. The method of claim 2 wherein in step g) a least-squares calculation is employed.

9. The method of claim 2 wherein in step d) a least-squares calculation is employed.

10. The method of claim 2 wherein in step f) a step function filter is employed.

11. The method of claim 10 wherein in step g) a least-squares calculation is employed.

12. The method of claim 2 wherein the MRI sequence is a spin echo sequence and data are acquired asymmetrically.

13. The method of claim 2 wherein the MRI sequence is a gradient echo sequence.

14. The method of claim 2 wherein the MRI sequence is an SSFP sequence.

15. A method of separating and imaging at least two chemical species using a magnetic resonance imaging (MRI) sequence comprising the steps of:
   a) acquiring undersampled MRI data using multiple coils at multiple echo times,
   b) low pass filtering the acquired data for each coil,
   c) performing a Fourier transform of the filtered data for each coil to obtain low resolution source images in the undersampled k-space direction for each coil,
   d) estimating low resolution species images and a magnetic field map for each coil using low resolution source images from that coil,
   e) combining the magnetic field maps from step d) into a combined coil field map,
   f) using the combined coil field map from step e) and the low resolution source images from step c), recalculating the low resolution species images,
   g) determining the phase of the low resolution species images for each coil,
   h) separately filtering the acquired data in step (a) for each coil with a transition filter and performing a Fourier transform of the filtered data to obtain filtered source images for each coil,
   i) estimating high resolution species images for each coil from the filtered source images in step (h) using the combined field map from step (e),
   j) demodulating the phase of low resolution species images for each coil determined from step (e) from estimated higher resolution species images
   k) calculating final species images from the real parts of the phase demodulated higher resolution species images for each coil, and
   l) combining final species images for each coil into combined species images.

16. The method of claim 15 wherein step h) a ramp transition function filter is employed.

17. The method of claim 16 wherein step i) a least-squares calculation is employed.

18. The method of claim 16 wherein step d) a least-squares calculation is employed.

19. The method of claim 15 wherein step h) a step function filter is employed.

20. The method of claim 15 wherein step d) a least-squares calculation is employed.

21. The method of claim 15 wherein step i) a least-squares calculation is employed.

22. The method of claim 15 wherein the MRI sequence is a spin echo sequence and data are acquired asymmetrically.

23. The method of claim 15 wherein the MRI sequence is a gradient echo sequence.

24. The method of claim 15 wherein the MRI sequence is an SSFP sequence.

* * * * *